United States Patent [19]
Levin et al.

[11] Patent Number: 5,638,061
[45] Date of Patent: Jun. 10, 1997

[54] TRACK BALL MECHANISM AND SWITCH ARRANGEMENT

[75] Inventors: Rod J. Levin, Palatine; Carl W. Stacy, Elmwood Park, both of Ill.

[73] Assignee: Zenith Electronics Corporation, Glenview, Ill.

[21] Appl. No.: 474,573

[22] Filed: Jun. 7, 1995

Related U.S. Application Data

[63] Continuation-in-part of Ser. No. 347,930, Dec. 1, 1994, abandoned.

[51] Int. Cl.[6] ................................. H03M 11/00
[52] U.S. Cl. ..................... 341/20; 345/157; 200/5 A
[58] Field of Search ........................... 341/20, 21, 22, 341/23, 35; 345/157, 160, 167; 200/5 A

[56] References Cited

U.S. PATENT DOCUMENTS

| | | | |
|---|---|---|---|
| 4,032,729 | 6/1977 | Koistinen | 200/5 A |
| 4,939,508 | 7/1990 | Lawrence | 340/710 |
| 5,237,311 | 8/1993 | Mailey | 340/710 |
| 5,367,316 | 11/1994 | Ikezaki | 345/158 |
| 5,371,553 | 12/1994 | Kawamura | 348/734 |
| 5,414,471 | 5/1995 | Saitoh | 348/565 |
| 5,430,263 | 7/1995 | English et al. | 200/5 A |
| 5,448,240 | 9/1995 | Morito | 341/20 |

OTHER PUBLICATIONS

IBM, "Enlarged Curser Key With Trackball," IBM Technical Disclosure Bulletin, Feb. 1991, vol. 33, No. 9, pp. 428–430.

*Primary Examiner*—John K. Peng
*Assistant Examiner*—Andrew Hill

[57] ABSTRACT

A track ball mechanism is mounted on a cantilevered portion of a printed circuit board that is supported in a housing. A switch, mounted on the opposite side of the cantilevered portion of the printed circuit board, is operated when it engages a boss on the housing. The ball of the track ball mechanism is operated by a human digit in the usual manner and the switch is operated when pressure on the ball deflects the cantilevered portion of the printed circuit board which causes the switch to engage the boss. The boss is supported on a cantilevered portion of the housing which deflects under excessive loading to protect the switch and track ball mechanism.

10 Claims, 1 Drawing Sheet

TRACK BALL MECHANISM AND SWITCH ARRANGEMENT

CROSS REFERENCE TO RELATED APPLICATIONS

This application is a continuation-in-part of application Ser. No. 08/347,930, now abandoned, and is related to copending applications Ser. Nos. 08/347,747 and 08/347,929, all filed Dec. 1, 1994 and all of which are assigned to Zenith Electronics Corporation.

BACKGROUND OF THE INVENTION AND PRIOR ART

This invention relates generally to remote control devices and particularly to remote control devices that include a so-called "track ball" mechanism. Track ball mechanisms are commonly used in computer mouses and in some video game control devices and are finding increasing use in television receivers having on-screen menus.

In the copending applications referred to above, the ball in the track ball mechanism of the controller is arranged for limited vertical movement in response to finger or thumb pressure for operating a switch that is positioned beneath the ball. The switch is used to activate a "select" function, i.e. initiate a control function or an option that is displayed on the screen of the television receiver. The present invention provides a simple, economic and improved track ball controller that includes a track ball actuated switch.

OBJECTS OF THE INVENTION

A principal object of the invention is to provide a novel track ball controller and switch arrangement.

Another object of the invention is to provide a simple, low cost track ball controller having a separate track ball actuated switch.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
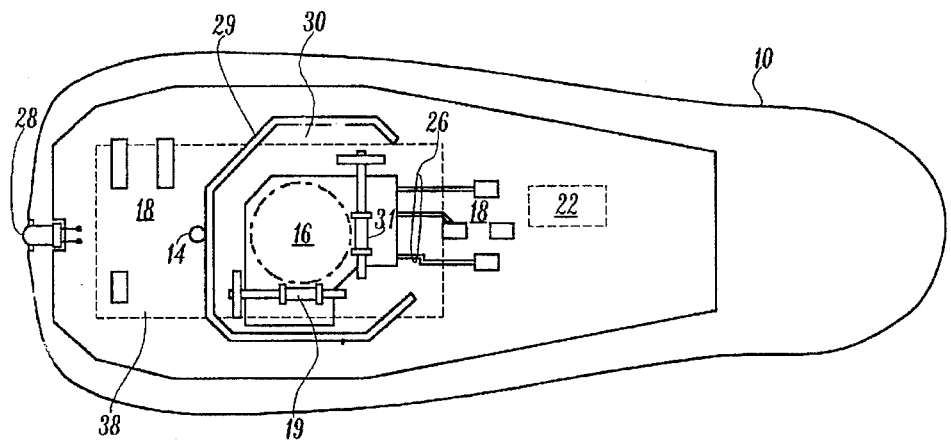
FIG. 1 is a simplified sectional plan view of a track ball controller constructed in accordance with the invention.
Figure 2:
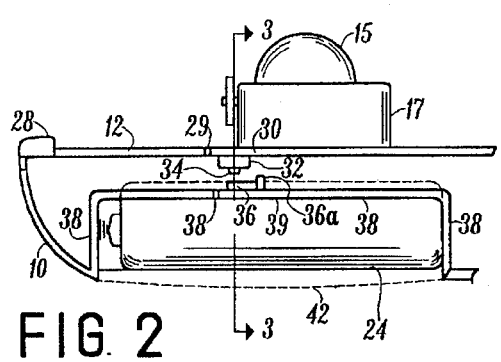
FIG. 2 is a partial side view of the controller of FIG. 1.
Figure 3:
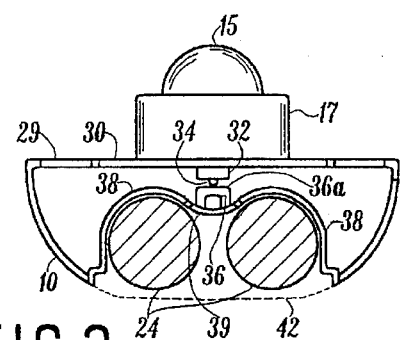
FIG. 3 is a sectional view taken along the line 3—3 of FIG. 2.

Referring to FIGS. 1, 2 and 3, a generally elongated contoured housing base 10 of a track ball controller supports a substantially similarly shaped printed circuit board 12 therein by means of one or more screws 14 that secure an upper cover section (not shown) to housing base 10. The housing base 10 is molded of rigid plastic and includes a plurality of integral supports (not shown) therein that support printed circuit board 12. A track ball mechanism 16 is mechanically mounted on and electrically coupled to printed circuit board 12. A plurality of keys 18, a microprocessor 22, a pair of batteries 24 and an LED 28 are all interconnected by means of a plurality of electrically conductive foils 26 on printed circuit board 12 in a conventional manner.

A generally square shaped cantilevered portion 30 is formed by a slot 29 in printed circuit support surface 12. Track ball mechanism 16 is mounted on the upper side of cantilever portion 30 and a switch 32 is mounted on the lower side. Housing base 10 has a molded-in battery compartment 38 that includes an upraised boss 36 on its outer surface (facing the underside of printed circuit board 12). Switch 32 has a push button actuator 34 that is engageable with boss 36. Track ball mechanism 16 comprises a ball 15 that is captivated in a base 17 when the upper cover section is secured in position over housing base 10. The track ball mechanism 16 is a readily available off-the-shelf product and includes the mechanical and electrical apparatus for generating digital IR X-Y coordinate information representative of rotational movement of the ball 15. In particular, the track ball mechanism includes a pair of rollers 19 and 31 that are driven by ball 15 to turn well known IR code wheels.

Figure 4:
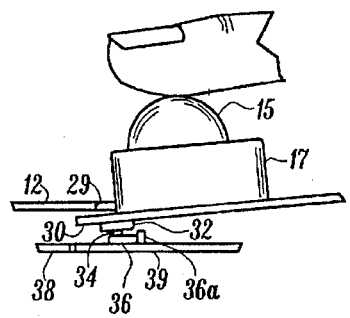
FIG. 4 is a partial view illustrating the track ball and switch operation.

As best shown in FIG. 4, the cantilever portion 30 of printed circuit board 12 is sufficiently rigid to permit a user to operate the ball 15 in a conventional, i.e. rotational, manner while enabling the user to operate switch 32 by applying downward pressure to ball 15. When ball 15 is depressed, the cantilever portion 30 of printed circuit board 12 is deflected (as illustrated) and switch 32 is operated by the push button actuator 34 engaging boss 36 on the outer surface of battery compartment 38 of housing base 10. It will be appreciated that FIG. 3 exaggerates the amount of deflection to more clearly illustrate the switch operation. In practice, the total deflection for normal operation of switch 32 is approximately 0.020 inches. Consequently, from the user's point of view, only ball 15 is moved downward; not a portion of the printed circuit board.

The provision of the relatively heavy batteries in the compartment 38 of the remote controller can give rise to a problem should the device be dropped on the ball from a height of a few feet onto a relatively hard surface. When the cantilever mounted switch 32 bottoms out against boss 36, the rollers 19 and 31 can be bent due to the inertia involved. To negate this possibility, boss 36 is also situated on a cantilevered portion 39 formed in the outer surface of battery compartment 38. As best seen in FIG. 3, the cross section of cantilevered portion 39 is arcuate and it is situated between the batteries 24. An upstanding pedestal portion 36a adds strength to boss 36.

Figure 5:
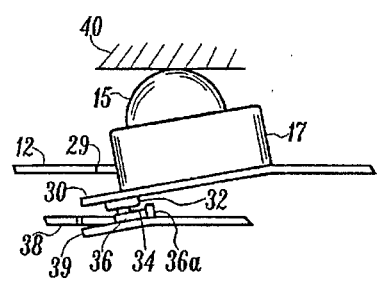
FIG. 5 is a similar view indicating operation of a mechanical shock protection feature of the invention.

In FIG. 5, switch 32 (and actuator 34) is shown deflecting cantilevered portion 39 away from the outer surface of compartment 38 in response to ball 15 encountering a rigid surface 40 (sufficient inertial force is assumed to be present to cause the deflection of cantilevered portion 39). The mechanical shock protection effect of cantilevered portion 39 cushions the loading of rollers 19 and 31 (and of switch 34) and prevents their being damaged. The shock, as mentioned above, is generally due to the controller device being dropped onto ball 15, with surface 40 representing a floor. The depiction in FIG. 5 is inverted to clarify the deflection of cantilevered portion 39 by ready comparison to the normal operation depicted in FIG. 4.

The inventive arrangement permits use of a standard track ball mechanism in conjunction with a standard switch that is operated in response to pressure applied to the ball. The inventive arrangement thus provides a simple, inexpensive track ball controller having a track ball operated switch.

It is recognized that numerous changes in the described embodiment of the invention will be apparent to those skilled in the art without departing from its true spirit and scope. The invention is to be limited only as defined in the claims.

What is claimed is:

1. A track ball controller comprising:

a printed circuit board;

a track ball mechanism mounted on said printed circuit board;

electrical connections on said printed circuit board connected to said track ball mechanism and a switch operable by deflection of said printed circuit board.

2. The controller of claim 1 wherein said switch is mounted on said printed circuit board and is operable by engagement with an obstruction adjacent to said printed circuit board.

3. The controller of claim 2 wherein said printed circuit board includes a cantilevered portion supporting said track ball mechanism and wherein said switch is mounted on the opposite side of said cantilevered printed circuit board.

4. The controller of claim 3, further including a housing containing said printed circuit board, and wherein said obstruction comprises;

a boss on said housing juxtaposed to said switch for engagement therewith.

5. The controller of claim 4 further comprising:

a second cantilevered portion, formed in said housing, and supporting said boss.

6. The controller of claim 5 further including a battery compartment formed in said housing and including said second cantilevered portion.

7. A track ball controller comprising:

a housing;

a printed circuit board secured in said housing, said printed circuit board including a cantilevered portion;

a track ball mechanism mounted on said cantilevered portion; and a switch mounted on the other side of said cantilevered portion and operable by deflection of said cantilevered portion forcing said switch to engage said housing responsive to pressure on said track ball mechanism.

8. The controller of claim 7 further including a boss on said housing juxtaposed to said switch for engagement therewith.

9. The controller of claim 8 further comprising a second cantilevered portion, formed in said housing, and supporting said boss.

10. The controller of claim 9 further including a battery compartment formed in said housing and including said second cantilevered portion.

* * * * *